US009236565B2

(12) United States Patent
Loong et al.

(10) Patent No.: US 9,236,565 B2
(45) Date of Patent: Jan. 12, 2016

(54) METHOD FOR FABRICATING A MAGNETORESISTIVE DEVICE

(71) Applicants: National University of Singapore, Singapore (SG); Yonsei University, Seoul (KR)

(72) Inventors: Li Ming Loong, Singapore (SG); Hyunsoo Yang, Singapore (SG); Wonho Lee, Seoul (KR); Jong-Hyun Ahn, Seoul (KR); Charanjit Singh Bhatia, Singapore (SG)

(73) Assignees: National University of Singapore, Singapore (SG); Yonsei University, Seoul (KR)

( * ) Notice: Subject to any disclaimer, the term of this patent is extended or adjusted under 35 U.S.C. 154(b) by 0 days.

(21) Appl. No.: 14/698,210

(22) Filed: Apr. 28, 2015

(65) Prior Publication Data
US 2015/0311434 A1    Oct. 29, 2015

Related U.S. Application Data

(60) Provisional application No. 61/996,086, filed on Apr. 29, 2014.

(51) Int. Cl.
*G11B 5/127* (2006.01)
*H01L 43/12* (2006.01)
*H01L 43/08* (2006.01)

(52) U.S. Cl.
CPC ............. *H01L 43/12* (2013.01); *G11B 5/127* (2013.01); *H01L 43/08* (2013.01)

(58) Field of Classification Search
CPC ................................. G11B 5/127; G11B 5/33
USPC ................................ 360/324.2, 324.1, 324.12
See application file for complete search history.

(56) References Cited

U.S. PATENT DOCUMENTS

| 6,163,442 | A  | * | 12/2000 | Gill et al. ........................ 360/317 |
| 6,239,685 | B1 | * | 5/2001  | Albrecht et al. ............... 337/365 |
| 8,331,064 | B2 | * | 12/2012 | Iben ............................ 360/324.2 |
| 2008/0108171 | A1 | * | 5/2008 | Rogers ................... B81C 1/0046 438/73 |
| 2013/0288078 | A1 | * | 10/2013 | Zhu et al. ....................... 428/827 |
| 2014/0043891 | A1 | * | 2/2014  | Edelstein et al. ............. 365/158 |

* cited by examiner

*Primary Examiner* — Allen T Cao
(74) *Attorney, Agent, or Firm* — Cesari and McKenna, LLP

(57) ABSTRACT

Embodiments of the invention provide a method for fabricating a magnetoresistive device. The method comprises: releasing a multi-layer magnetoresistive structure for forming the magnetoresistive device from a first substrate to relax an intrinsic stress in the multi-layer magnetoresistive structure such that the magnetic and/or magnetoresistive properties of the magnetoresistive device can be improved. The magnetic and/or magnetoresistive properties include, but are not limited to coercivity, squareness or abruptness of switching, magnetoresistance (MR) and resistance of the magnetoresistive device.

20 Claims, 8 Drawing Sheets

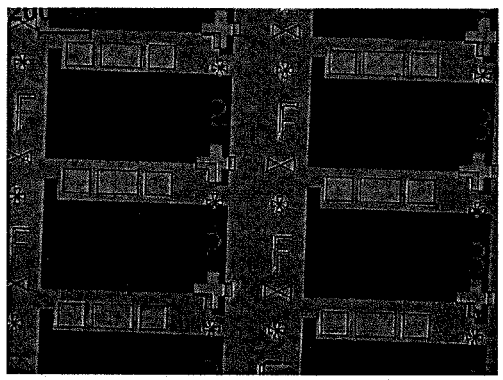 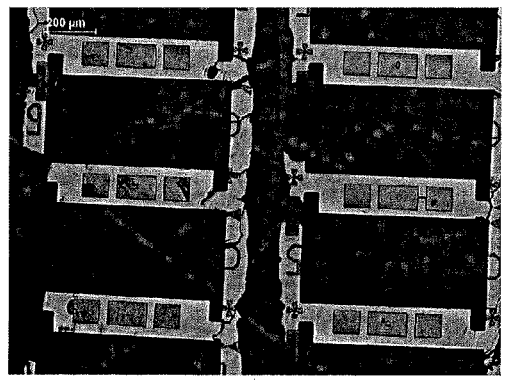
Figure 7A					Figure 7B
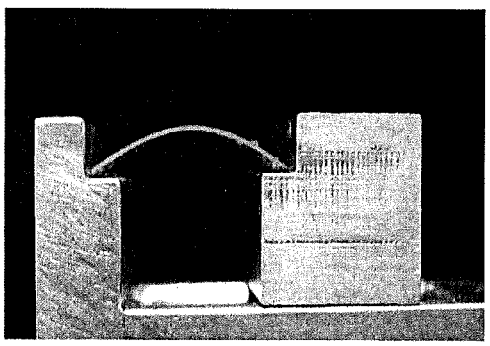 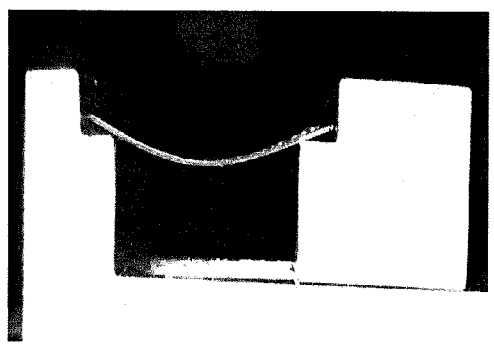
Figure 8A					Figure 8B

METHOD FOR FABRICATING A MAGNETORESISTIVE DEVICE

CROSS-REFERENCE TO RELATED APPLICATIONS

This application claims the benefit of U.S. Provisional Application No. 61/996,086, filed on Apr. 29, 2014. The contents of both applications are hereby incorporated by reference in their entirety.

BACKGROUND OF THE INVENTION

1. Field of the Invention

The invention generally relates to magnetoresistive devices, and more particularly, a method for fabricating a magnetoresistive device to improve magnetic and/or magnetoresistive properties of the magnetoresistive device.

2. Background Information

As well known, more desirable magnetic properties of a magnetoresistive device, e.g. coercivity, squareness or abruptness of switching, and magnetoresistance (MR), may be obtained through applying a strain on a magnetoresistive structure in the magnetoresistive device.

One of the existing methods for applying a strain to the magnetoresistive structure requires a stressor layer deposited on the magnetoresistive structure. This will increase the fabrication cost and complexity. In another existing method, the magnetoresistive structure is directly grown on a flexible polymeric substrate, and then a strain can be applied to the magnetoresistive structure by deforming the flexible polymeric substrate. However, this method has a limited application scope because only flexible polymeric substrates can be used in this method, and also because of the physical properties of the flexible polymeric substrates, e.g. a high surface roughness and poor high temperature resistance, i.e. the flexible polymeric substrates cannot suffer high temperature treatments.

SUMMARY OF THE INVENTION

According to one aspect of the invention, a method for fabricating a magnetoresistive device is provided. The method comprises: releasing a multi-layer magnetoresistive structure which is to be used for forming the magnetoresistive device, from a first substrate to relax an intrinsic stress in the multi-layer magnetoresistive structure to improve magnetic and/or magnetoresistive properties of the magnetoresistive device.

In this method, a strain is provided to the multi-layer magnetoresistive structure due to an intrinsic stress relaxation in the magnetoresistive structure when the magnetoresistive structure is released from the first substrate. It has been proved by many experimental results that with this method, the magnetic and/or magnetoresistive properties of the magnetoresistive device can be improved. The magnetic and/or magnetoresistive properties of the magnetoresistive device include coercivity, squareness or abruptness of switching, magnetoresistance (MR) and resistance of the magnetoresistive device.

In one embodiment of the invention, the multi-layer magnetoresistive structure includes a top electrically conducting layer, an electrically insulating encapsulation layer, a magnetoresistive element, a bottom electrically conducting layer and an etch stop layer. The magnetoresistive element in the multi-layer magnetoresistive structure may include a magnetic tunnel junction (MTJ) or a double MTJ or a giant magnetoresistive (GMR) structure.

Typically, the intrinsic stress in the multi-layer magnetoresistive structure may include an intrinsic stress of any layer in the magnetoresistive structure.

In order to form the magnetoresistive device, the method further comprises: integrating the released multi-layer magnetoresistive structure with a second substrate. The second substrate may be any one selected from a group consisting of: conventional rigid substrates, flexible polymeric substrates, wafers, glass, foil, polydimethylsiloxane (PDMS) substrates, plastic and nitrile rubber substrates.

In order to further provide a strain to the multi-layer magnetoresistive structure, the second substrate is selected from deformable substrates, and the method further comprises: deforming the second substrate to provide a strain to the multi-layer magnetoresistive structure. The strain provided by deforming the second substrate may be a tensile or a compressive strain.

In order to provide a strain with a predetermined value and/or configuration to the magnetoresistive structure, during fabrication of the multi-layer magnetoresistive structure, the intrinsic stress in the multi-layer magnetoresistive structure is engineered to a predetermined value and/or configuration.

The step of engineering the intrinsic stress in the multi-layer magnetoresistive structure comprises: selecting a material and/or a thickness of an underlayer, an encapsulation layer, a capping layer or any other layer in the magnetoresistive structure; determining a thin film deposition condition; determining an annealing condition; and/or selecting a configuration of the magnetoresistive structure, based on the predetermined value and/or configuration of the intrinsic stress.

According to another aspect of the invention, a magnetoresistive device is provided which is fabricated according to the method disclosed in the embodiments of the invention.

According to another aspect of the invention, a sensor, a data storage device or a strain gauge is provided which has a magnetoresistive device fabricated according to the method disclosed in the embodiments of the invention.

BRIEF DESCRIPTION OF THE DRAWINGS

The invention description below refers to the accompanying drawings, of which:

FIG. 7A and FIG. 7B respectively show the optical images of one example of the pre-transferred device and one example of the post-transferred device;

FIG. 8A shows a side view of the strain testing setup which enables the post-transferred device to be subjected to a tensile strain during TMR measurements; and FIG. 8B shows a side view of the strain testing setup which enables the post-transferred device to be subjected to a compressive strain during TMR measurements.

DETAILED DESCRIPTION

Figure 1:
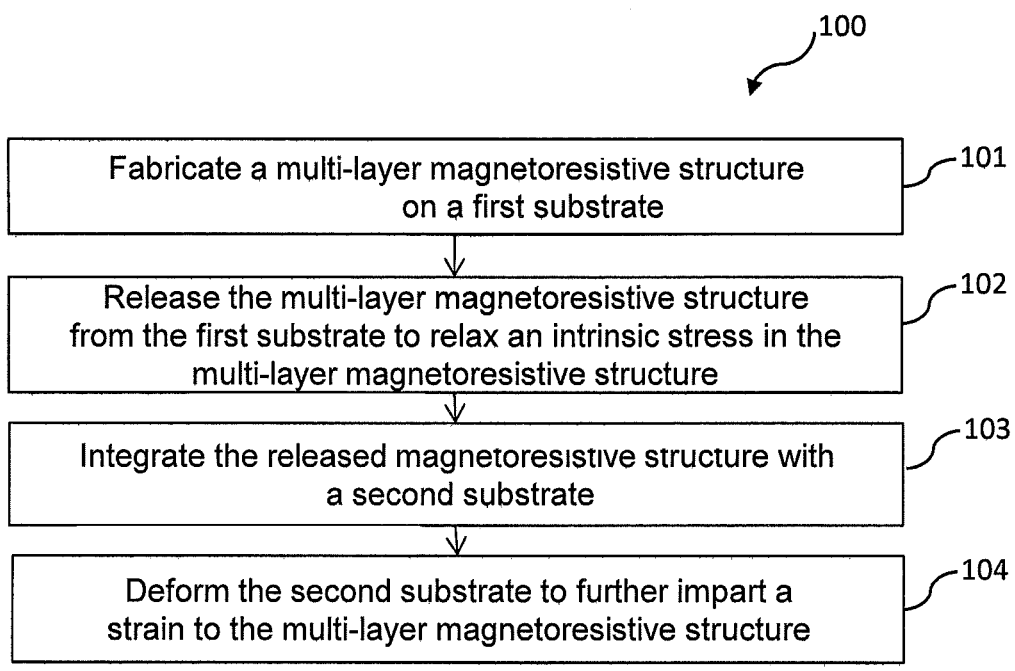
FIG. 1 is a flow chart illustrating a method for fabricating a magnetoresistive device according to a first embodiment of the invention.

In the following description, numerous specific details are set forth in order to provide a thorough understanding of various illustrative embodiments of the invention. It will be understood, however, to one skilled in the art, that embodiments of the invention may be practiced without some or all of these specific details. It is understood that the terminology used herein is for the purpose of describing particular embodiments only, and is not intended to limit the scope of the invention. In the drawings, like reference numerals refer to same or similar functionalities or features throughout the several views.

Embodiments of the invention provide a method for fabricating a magnetoresistive device including a multi-layer magnetoresistive structure. In this method, a strain is provided to the multi-layer magnetoresistive structure in the magnetoresistive device due to an intrinsic stress relaxation in the magnetoresistive structure when the magnetoresistive structure is released from an original substrate (a first substrate), to improve the magnetic and/or magnetoresistive properties of the magnetoresistive device.

FIG. 1 is a flow chart illustrating a method 100 for fabricating a magnetoresistive device 200 according to a first embodiment of the invention. In this embodiment, the magnetoresistive device 200 includes a multi-layer magnetoresistive structure 201 and a second substrate 205, as shown in FIG. 2C. The magnetoresistive structure 201 in the magnetoresistive device 200 is released from the first substrate 202, as shown in FIGS. 2A and 2B.

Figure 2A:
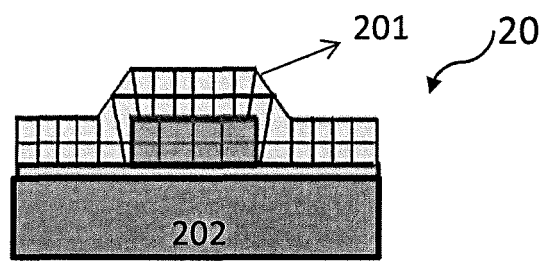
FIG. 2A is a schematic diagram illustrating a sectional view of a magnetoresistive structure fabricated on a first substrate, i.e. a pre-transferred device, according to the first embodiment.
Figure 2B:
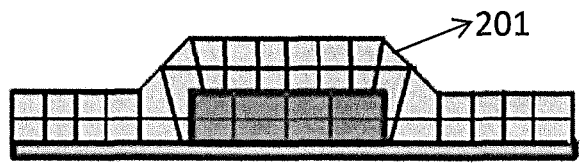
FIG. 2B is a schematic diagram illustrating a sectional view of the magnetoresistive structure released from the first substrate.
Figure 2C:
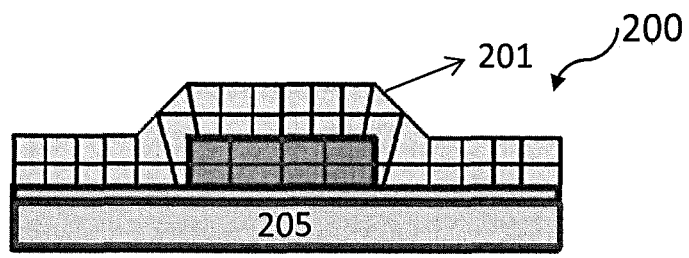
FIG. 2C is a schematic diagram illustrating a sectional view of the magnetoresistive device, i.e. the post-transferred device, according to the first embodiment.

In block 101, optionally, a multi-layer magnetoresistive structure 201 is fabricated on a first substrate 202 to form a pre-transferred device 20, as shown in FIG. 2A.

In this embodiment, the first substrate 202 may be any suitable conventional rigid substrate, e.g. Silicon (Si) substrate.

Figure 2D:
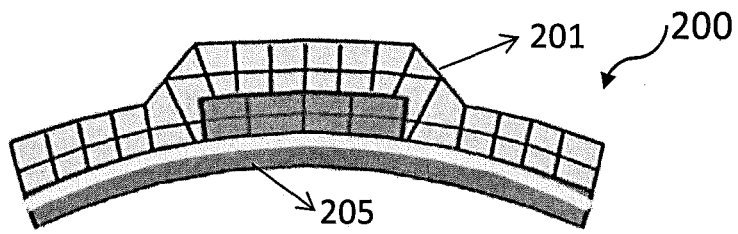
FIG. 2D is a schematic diagram illustrating a sectional view of the deformed magnetoresistive device according to one example of the first embodiment.
Figure 3A:
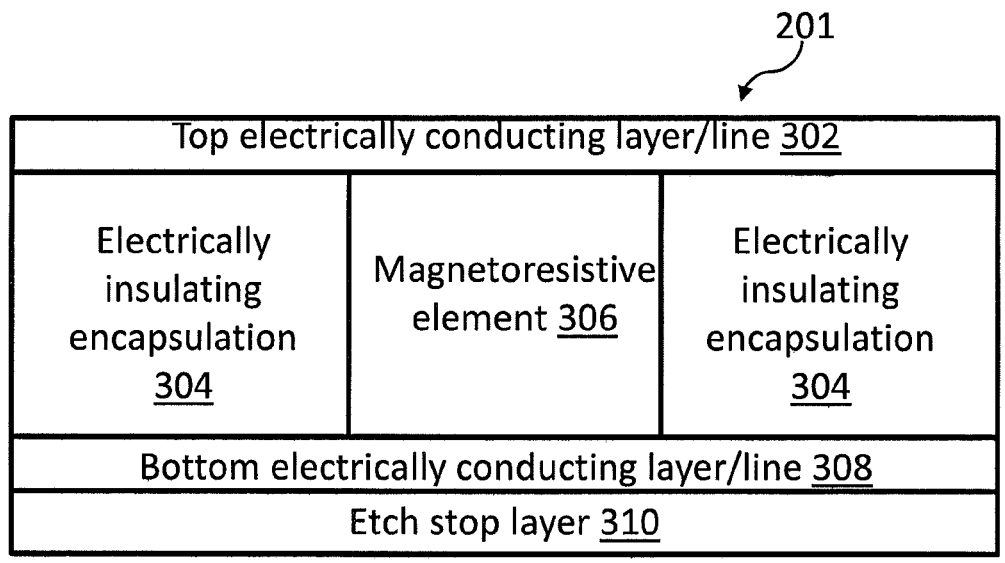
FIG. 3A is a schematic diagram illustrating a multi-layer structure of the magnetoresistive structure in FIGS. 2A-2D.

Referring to FIG. 3A which illustrates the detailed multi-layer structure of the magnetoresistive structure 201 in FIGS. 2A-2D, the magnetoresistive structure 201 includes a top electrically conducting layer/line 302, an electrically insulating encapsulation layer 304, a magnetoresistive element 306, a bottom electrically conducting layer/line 308 and an etch stop layer 310.

Figure 3B:
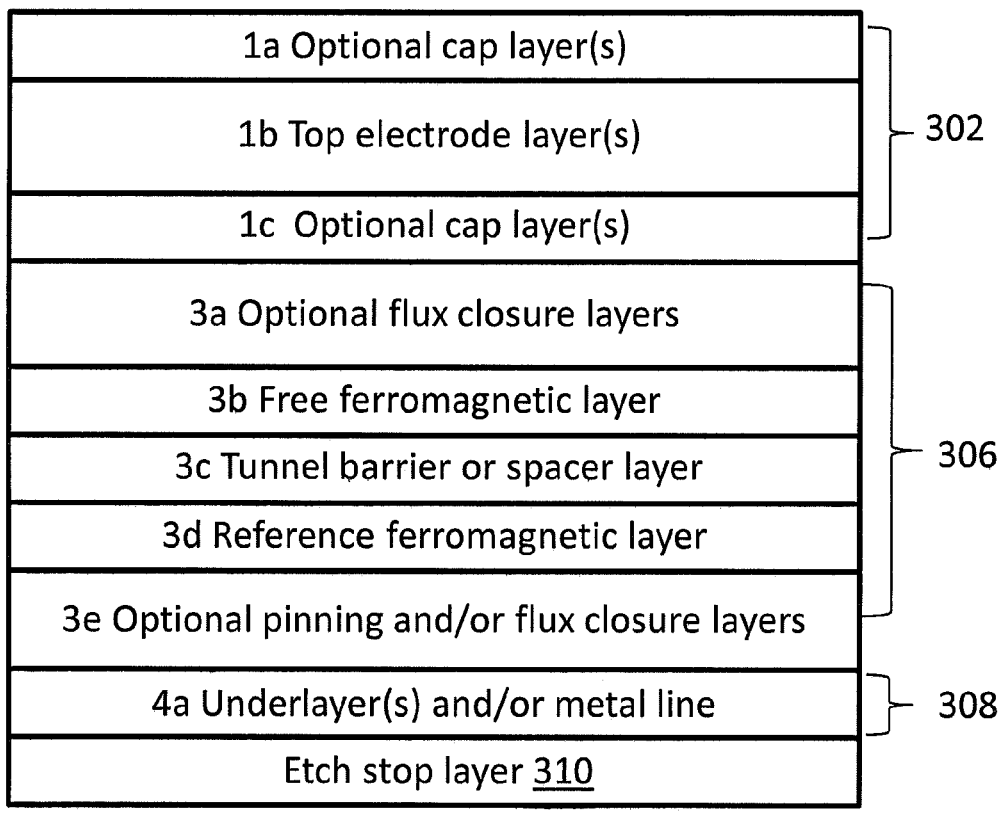
FIG. 3B is a schematic diagram illustrating a detailed structure of some layers in the magnetoresistive structure in FIG. 3A.

Typically, as shown in FIG. 3B, the top electrically conducting layer/line 302 may include a first optional cap layer(s) 1a, a second optional cap layer(s) 1c and a top electrode layer(s) 1b located between the first and the second optional cap layer(s) 1a and 1c. The magnetoresistive element 306 may include from top to bottom, optional flux closure layers 3a, free ferromagnetic layers 3b, a tunnel barrier or spacer layer 3c, a reference ferromagnetic layer 3d and optional pinning and/or flux closure layers 3e. The bottom electrically conducting layer/line 308 may include an underlayer(s) and/or metal line 4a. The typical function of the underlayer(s) in the layer 4a is to provide a more optimized surface for the growth/fabrication of subsequent layers above the layer 4a.

Figure 3C:
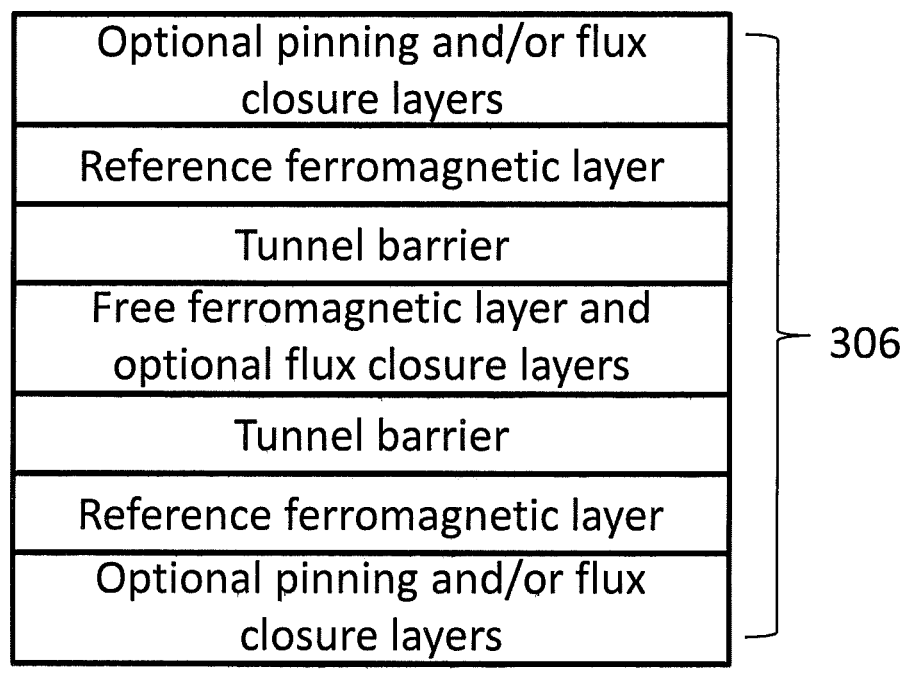
FIG. 3C is a schematic diagram illustrating an alternative structure of the magnetoresistive element in FIG. 3A.

It should be noted that the order of the layers 3a-3e may be inverted in the magnetoresistive element 306. The magnetoresistive element 306 is a magnetic tunnel junction (MTJ) if the layer 3c is a tunnel barrier or a giant magnetoresistive (GMR) device if the layer 3c is a non-magnetic, electrically conducting spacer layer. Alternatively, the magnetoresistive element 306 may have a detailed structure shown in FIG. 3C, which is a double magnetic tunnel junction (MTJ).

The magnetoresistive structure 201 may function as a magnetic field sensor or data storage memory cell through configuring the magnetization direction and the magnetic anisotropy in the layers 3b and 3d. The magnetoresistive structure 201 may also function as a strain gauge.

The layer 3e may include an antiferromagnetic material layer if the layer 3e is configured as a pinning layer for the layer 3d. If layers 3a and/or 3e are configured as flux closure layers for layers 3b and/or 3d, respectively, then layers 3a and/or 3e would each include a non-magnetic, electrically conducting spacer material layer and a ferromagnetic layer. The spacer material layer would enable the antiparallel interlayer exchange coupling of layer 3b and/or 3d with the ferromagnetic layer. If the layer 3e is configured to provide both pinning and flux closure for the layer 3d, then the layer 3e would include an antiferromagnetic material layer, a non-magnetic, electrically conducting spacer material layer and a ferromagnetic layer.

This is an optional step because the pre-transferred device 20 may be prepared by a third party and provided to the manufacturer of the magnetoresistive device 200.

In block 102, the multi-layer magnetoresistive structure 201 is released from the first substrate 202 to relax an intrinsic stress in the multi-layer magnetoresistive structure 201 to improve magnetic and/or magnetoresistive properties of the magnetoresistive device 200. The magnetic and/or magnetoresistive properties include, but are not limited to coercivity, squareness or abruptness of switching, magnetoresistance, and resistance of the magnetoresistive device 200.

The multi-layer magnetoresistive structure 201 may be released from the first substrate 202 by etching techniques, laser annealing, chemical solution, or being directly peeled off. If an etching technique is used to release the multi-layer magnetoresistive structure 201, the relaxation of the intrinsic stress in the multi-layer magnetoresistive structure 201 may be controlled by adjusting the etching thickness during the releasing process of the magnetoresistive structure 201.

The released magnetoresistive structure 201 is shown in FIG. 2B. Referring to FIGS. 2A and 2B, in this embodiment, when the magnetoresistive structure 201 is released from the first substrate 202, the intrinsic stress in the magnetoresistive structure 201 is completely or partially relaxed such that a strain is considered to be provided to the magnetoresistive structure 201.

The intrinsic stress in the magnetoresistive structure 201 may be generated in each layer of the magnetoresistive structure 201 as shown in FIG. 3A. Accordingly, a relaxation of the intrinsic stress in the magnetoresistive structure 201 may occur in any layer in the magnetoresistive structure 201.

Furthermore, in order to control the relaxation of the intrinsic stress in the magnetoresistive structure 201 such that a strain with a predetermined value and/or configuration is to be provided to the magnetoresistive structure 201 to make sure a desirable magnetic and/or magnetoresistive property is obtained in the magnetoresistive device 200, according to one example of the embodiment, the multi-layer magnetoresistive structure 201 in FIG. 2A is prepared to have an intrinsic stress with a, predetermined value and/or configuration, i.e. the intrinsic stress in the magnetoresistive structure 201 is engineered to achieve a predetermined value and/or configuration. The configuration of the intrinsic stress or strain includes a direction(s) of the intrinsic stress or strain, e.g. uniaxial tensile/compressive stress or strain, biaxial tensile/compressive stress/strain.

Various methods can be used for engineering the intrinsic stress in the magnetoresistive structure 201 to a predetermined value and/or configuration. The methods include, but are not limited to the following:

selecting a material and/or a thickness of an underlayer, an encapsulation layer, a cap layer or any other layer in the magnetoresistive structure 201;

determining a thin film deposition condition, e.g. the power and/or the pressure used in a thin film deposition process during the fabrication of the multi-layer magnetoresistive structure 201;

determining an annealing condition, e.g. the temperature and/or duration of the annealing process during the fabrication of the multi-layer magnetoresistive structure 201; and/or selecting a configuration of the magnetoresistive structure 201 that can result in the predetermined value and/or configuration. The configuration of the magnetoresistive structure 201 may include a shape and/or aspect ratio of the magnetoresistive structure 201.

One example of engineering the intrinsic stress in the magnetoresistive structure 201 to a predetermined value and/or configuration is described below:

During fabrication of the pre-transferred device 20, the electrically insulating encapsulation layer in the magnetoresistive structure 201 is engineered to have a predetermined amount of in-plane intrinsic compressive stress through selecting an appropriate material and deposition conditions for the electrically insulating encapsulation layer. In addition, the shape/configuration of the magnetoresistive structure 201 is designed with corners to concentrate the intrinsic compressive stress in the magnetoresistive structure 201. Thus, when the magnetoresistive structure 201 is released from the first substrate 202, the relaxation of the intrinsic compressive stress in the magnetoresistive structure 201 will cause an in-plane tensile strain with a predetermined value and configuration to be provided to the magnetoresistive structure 201. The value of the in-plane tensile strain may not be uniform, as it would be directed by the aforementioned shape/configuration of the magnetoresistive structure 201 to be higher in some areas and lower in others, as desired.

In block 103, the released magnetoresistive structure 201 is integrated with a second substrate 205 to form the post-transferred device 200, i.e. the magnetoresistive device 200, as shown in FIG. 2C.

Since the magnetoresistive structure 201 may function as a magnetic field sensor, a data storage memory cell or a strain gauge, accordingly the magnetoresistive device 200 may be a magnetic field sensor, a data storage device or a strain gauge.

In this embodiment of the invention, the second substrate 205 may be any one selected from a group consisting of conventional rigid substrates, e.g. Si substrates, wafers, glass, foil, polydimethylsiloxane (PDMS) substrates, plastic and nitrile rubber substrates/surfaces, etc. In order to further improve the magnetic and/or magnetoresistive properties of the magnetoresistive device 200, the second substrate 205 may be a deformable substrate, such as a flexible polymeric substrate, e.g. polyethylene terephthalate (PET), polyethylene naphthalate (PEN), polyethersulfone (PES), polyimide (PI), and polydimethylsiloxane (PDMS), etc. This will be described in detail in block 104.

Many methods may be used for integrating the released magnetoresistive structure 201 with the second substrate 205. Typically, the integrating process includes a transferring step for transferring the released magnetoresistive structure 201 to the second substrate 205 by a transferring carrier, e.g. a PDMS stamp, a tape, etc. In some methods, the integrating process may further comprise a bonding step for bonding the released magnetoresistive structure 201 to the second substrate 205. After the magnetoresistive structure 201 is integrated with the second substrate 205, the transferring carrier may be removed. Some of the methods for integrating the released magnetoresistive structure 201 with the second substrate 205 will be explained below.

The magnetoresistive structure 201 may be integrated with the second substrate 205 by using a modified PDMS stamp having a rough surface or patterned surface. The modified PDMS stamp is selected as the transferring carrier to transfer the magnetoresistive structure 201 to the second substrate 205. Due to the special surface of the modified PDMS stamp, a weaker van der Waals force is formed between the modified PDMS stamp and magnetoresistive structure 201 due to a diminished contacting area. Thus, the magnetoresistive structure 201 would be integrated with the second substrate 205 due to a van der Waals force between the magnetoresistive structure 201 and the second substrate 205 which is higher than the van der Waals force between the magnetoresistive structure 201 and the modified PDMS stamp. It should be noted that any other transferring carrier which has a property similar to the modified PDMS stamp may be used in this method. Specifically, any other transferring carrier that has a property that would cause the van der Waals force between the magnetoresistive structure 201 and the transferring carrier to be lower than that between the magnetoresistive structure 201 and the second substrate 205 may be used in this method.

The magnetoresistive structure 201 may be integrated with the second substrate 205 by using a thermal release tape. In this method, the thermal release tape is selected as a transferring carrier to transfer the magnetoresistive structure 201 to the second substrate 205. When the released magnetoresistive structure 201 held by the thermal release tape, and the second substrate 205 are put together and heated, the thermal release tape will lose its adhesive property and the magnetoresistive structure 201 would be integrated with the second substrate 205 by a van der Waals force.

After being transferred to the second substrate 205 by using a transferring carrier, the magnetoresistive structure 201 may be bonded to the second substrate 205 by using a glue or adhesive layer which is provided on one surface of the second substrate 205. The glue or adhesive layer has a stronger adhesive force compared with the transferring carrier. Therefore, after the magnetoresistive structure 201 is bonded to the second substrate 205, the transferring carrier would be easily removed from the magnetoresistive structure 201.

In another method, in order to integrate the magnetoresistive structure 201 with the second substrate 205, a surface of the magnetoresistive structure 201 is plasma treated to form a strong chemical bonding between the magnetoresistive structure 201 and the second substrate 205. After the magnetoresistive structure 201 is transferred to the second substrate 205 by using a transferring carrier, the magnetoresistive structure 201 would be bonded to the second substrate 205 due to the strong chemical bonding formed by the plasma treatment.

In addition, the conventional methods involving high temperature or high pressure, or the industrial methods such as wafer direct bonding, surface-activated bonding, atomic diffusion bonding, etc., may also be used for bonding the magnetoresistive structure 201 to the second substrate 205 after the magnetoresistive structure 201 is transferred to the second substrate 205 by using a transferring carrier.

It should be noted that a strain may be provided to the magnetoresistive structure 201 by tuning the adhesion to the second substrate 205, e.g. by using different methods for integrating the magnetoresistive structure 201 with the second substrate 205. The strain provided by the bonding process may be used to make sure a strain with a predetermined value and/or configuration is provided to the magnetoresistive structure 201. Specifically, the strain provided by the bonding process may be used to augment, partially offset, or modify the value and/or configuration of the strain provided to the magnetoresistive structure 201 due to the intrinsic stress relaxation.

In block 104, optionally, the second substrate 205 is deformed to provide a strain to the multi-layer magnetoresistive structure 201.

If the second substrate 205 is a deformable substrate, e.g. a plastic substrate, a flexible polymeric substrate, etc., referring to FIG. 2D, when the second substrate 205 is deformed to a convex contour, a tensile strain would be provided to the multi-layer magnetoresistive structure 201. Conversely, if the second substrate 205 is deformed to a concave contour, a compressive strain would be provided to the multi-layer magnetoresistive structure 201.

Many experiments have been conducted to prove that the magnetic and/or magnetoresistive properties of a magnetoresistive device fabricated according to the method disclosed in the embodiments of the invention (i.e. a post-transferred device) are improved compared with a conventional magnetoresistive device (i.e. a pre-transferred device). Some of the measurement results are shown in FIGS. 4A-6B, and are to be explained below. In the experiments, two devices are used as samples: a pre-transferred device having a magnetoresistive structure fabricated on a Si substrate as shown in FIG. 7A, and a post-transferred device having a magnetoresistive structure released from the pre-transferred device and integrated with a PET substrate, as shown in FIG. 7B. The magnetoresistive structure includes a MTJ.

(1) Magnetoresistance Measurements

Figure 4A:
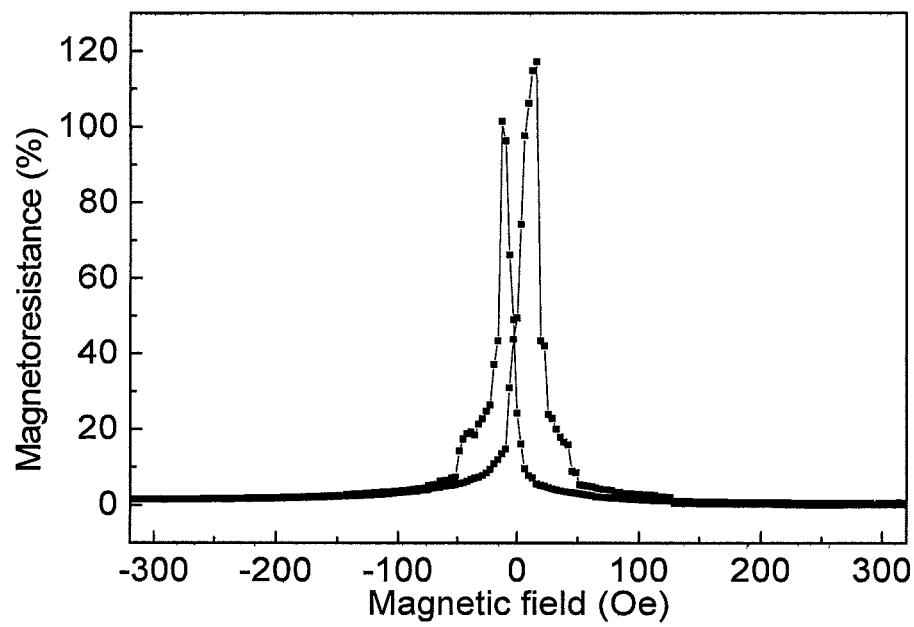
FIG. 4A is a graph showing the results of magnetoresistance measurements of a pre-transferred device.
Figure 4B:
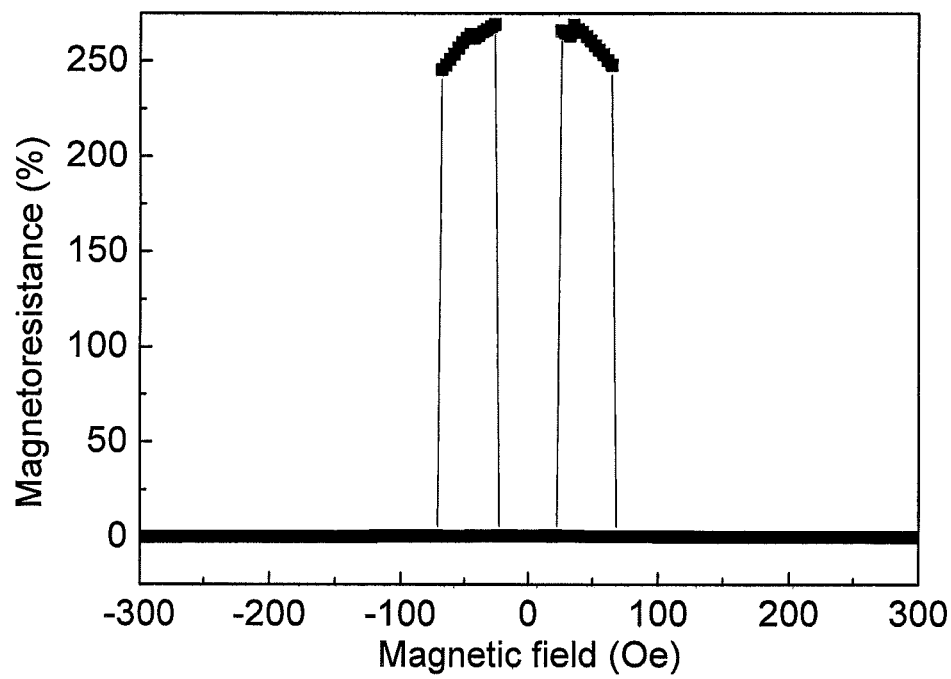
FIG. 4B is a graph showing the results of magnetoresistance measurements of a post-transferred device.

As shown in FIG. 4B, the magnetoresistance of the post-transferred device is more than 225(%) when the magnetic field is within −75-75 (Oe), while the magnetoresistance of the pre-transferred device (see FIG. 4A) is less than 120(%) when the magnetic field is within the same range. The measurement results show that the post-transferred device has a higher tunneling magnetoresistance (TMR) compared with the pre-transferred device.

(2) TMR Measurements of the Post-Transferred Device During Different Stages of Tensile/Compressive Testing FIGS. 8A and 8B show the side views of a strain testing setup which respectively enables the post-transferred device to be subjected to a tensile and a compressive strain during TMR measurements.

Figure 5A:
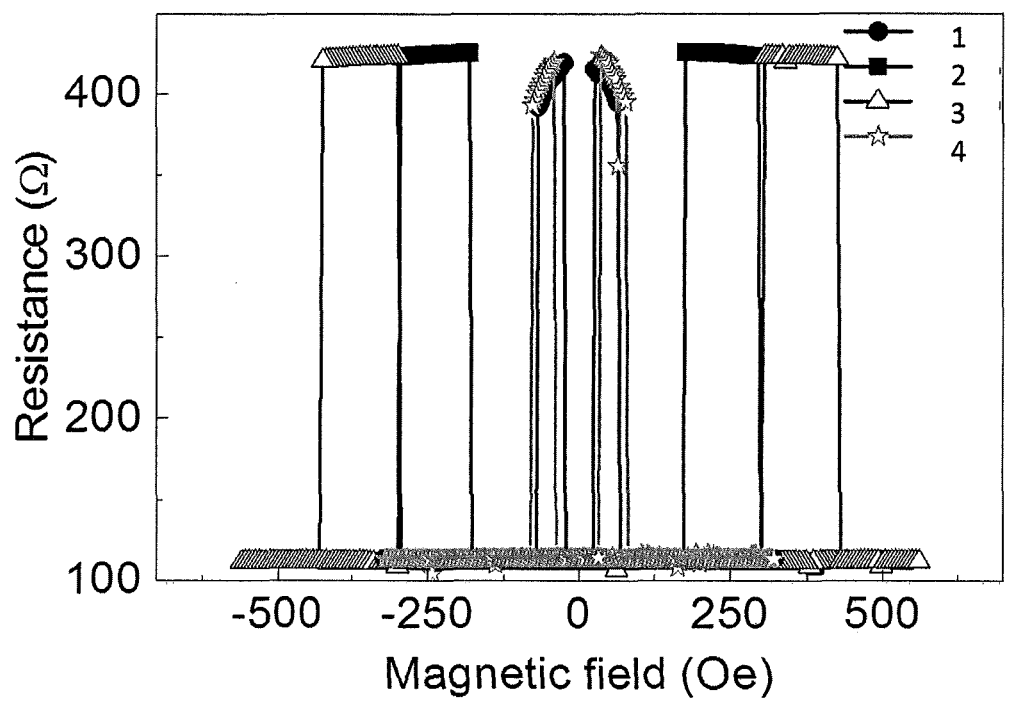
FIG. 5A is a graph showing the results of tunneling magnetoresistance (TMR) measurements of the post-transferred device during different stages of tensile testing.
Figure 5B:
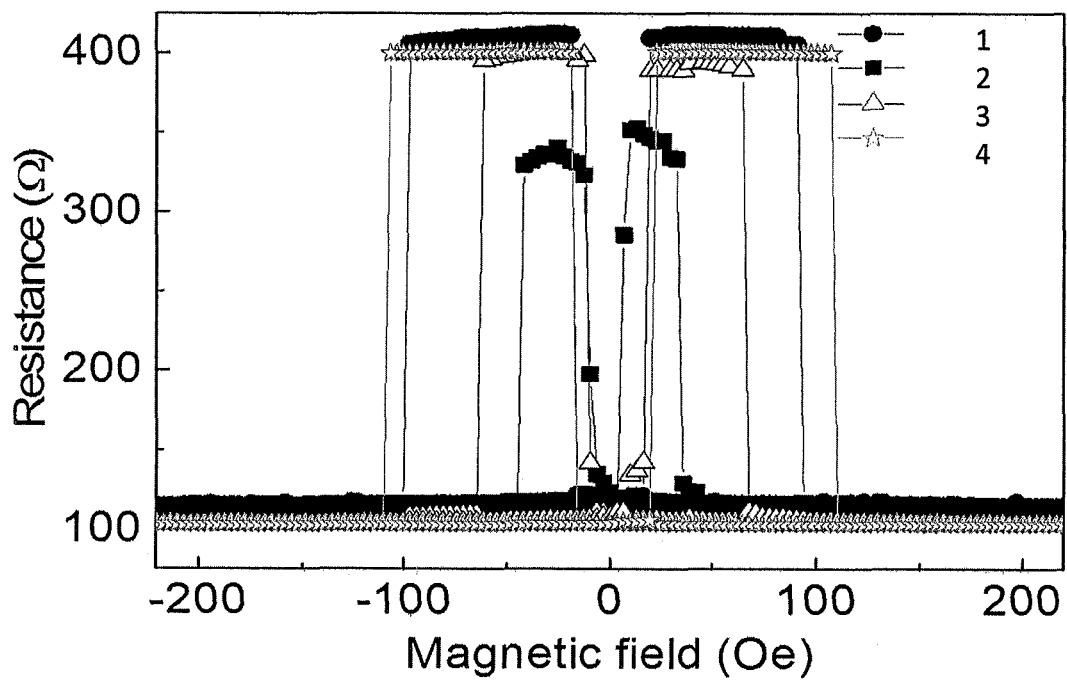
FIG. 5B is a graph showing the results of TMR measurements of the post-transferred device during different stages of compressive testing.

FIG. 5A shows the results of the TMR measurements of the post-transferred device during different stages of tensile testing. In FIG. 5A, the curve 1 represents the measurement results under an initial state of the post-transferred device; the curve 2 represents the measurement results under a 0.6% uniaxial tensile strain; the curve 3 represents the measurement results under a 0.7% uniaxial tensile strain; the curve 4 represents the measurement results when the uniaxial tensile strain is removed. FIG. 5B shows the results of the TMR measurements of the post-transferred device during different stages of compressive testing. In FIG. 5B, the curve 1 represents the measurement results under an initial state of the post-transferred device; the curve 2 represents the measurement results under a 0.3% uniaxial compressive strain; the curve 3 represents the measurement results under a 0.3% uniaxial compressive strain with the direction of the magnetic field being rotated in-plane 10° away from the initial magnetic easy axis of the post-transferred magnetoresistive device; the curve 4 represents the measurement results when the uniaxial compressive strain is removed. The measurement results show that even under a strain, the post-transferred device yields a high and robust TMR.

(3) TMR Measurements of the Post-Transferred Device Under a Repeated Strain

Figure 6A:
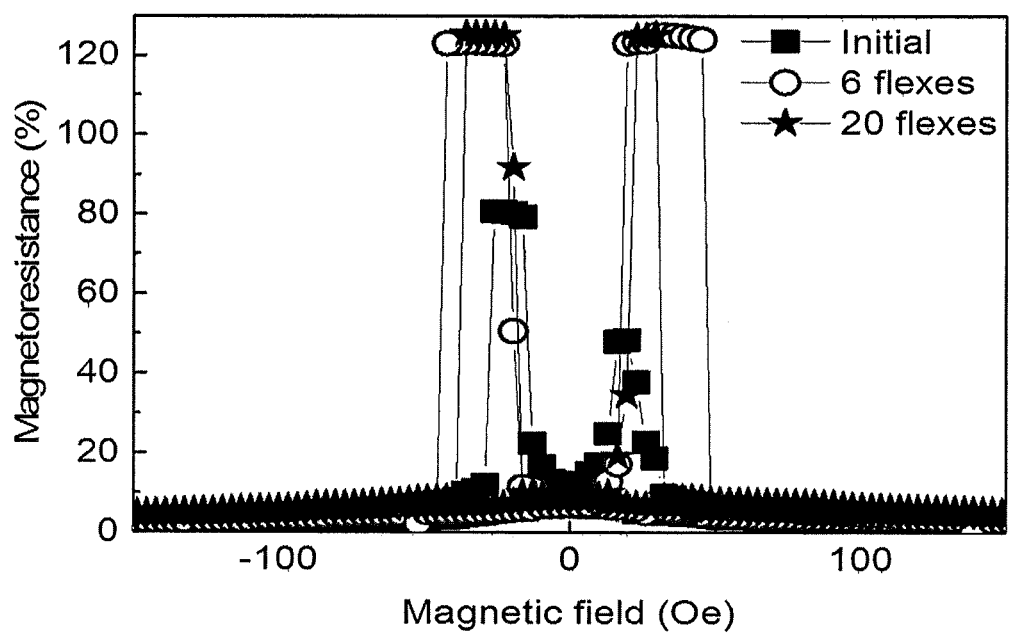
FIG. 6A is a graph showing results of TMR measurements of the post-transferred device at the initial state, and after 6 flexes and 20 flexes at a 0.2% strain.
Figure 6B:
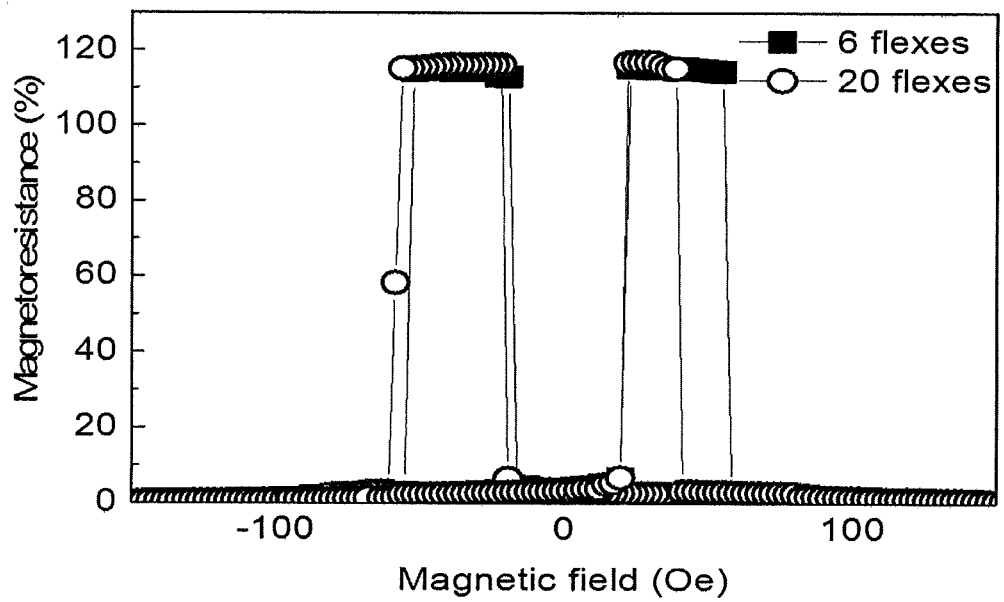
FIG. 6B is a graph showing results of TMR measurements of the post-transferred device after another 6 flexes and 20 flexes at a 0.4% strain.

FIG. 6A shows the results of TMR measurements of the post-transferred device at the initial state, and after 6 flexes and 20 flexes at a 0.2% strain. The flexes refer to alternately applying a tensile and compressive strain to the post-transferred device. FIG. 6B shows the results of TMR measurements of the post-transferred device after another 6 flexes and 20 flexes at a 0.4% strain. The measurement results show the durability of the TMR under a repeated strain.

As will be appreciated from the above, the method for fabricating a magnetoresistive device disclosed in embodiments of the invention does not require a stressor layer to provide a strain to the magnetoresistive structure. Instead, it relies on the relaxation of an intrinsic stress in the magnetoresistive structure when the magnetoresistive structure is released from the first substrate, to provide a strain to the magnetoresistive structure such that the magnetic and/or magnetoresistive properties of the magnetoresistive device can be improved. Therefore, the method disclosed in embodiments of the invention is simple and cost effective. Furthermore, embodiments of the invention allow for the integration of a magnetoresistive structure onto various types of substrates/surfaces, including conventional rigid substrates, flexible substrates, wafers, glass, foil, PDMS stamps, plastic and nitrile rubber. The design constraints of the existing method have been overcome.

Additionally, the value and/or configuration of the strain provided to the magnetoresistive structure may be controlled by engineering the intrinsic stress in the magnetoresistive structure, controlling the etching thickness during the process of releasing the magnetoresistive structure from the first substrate, and/or tuning the adhesion to the second substrate.

It is to be understood that the embodiments and features described above should be considered exemplary and not restrictive. Many other embodiments will be apparent to those skilled in the art from consideration of the specification and practice of the invention. The scope of the invention should, therefore, be determined with reference to the appended claims, along with the full scope of equivalents to which such claims are entitled. Furthermore, certain terminology has been used for the purposes of descriptive clarity, and not to limit the disclosed embodiments of the invention.

The invention claimed is:

1. A method for fabricating a magnetoresistive device, comprising:
   releasing a multi-layer magnetoresistive structure, which is to be used for forming the magnetoresistive device, from a first substrate to relax an intrinsic stress in the multi-layer magnetoresistive structure to improve magnetoresistive properties or both magnetic and magnetoresistive properties of the magnetoresistive device.

2. The method of claim 1, wherein the multi-layer magnetoresistive structure includes a top electrically conducting layer, an electrically insulating encapsulation layer, a magnetoresistive element, a bottom electrically conducting layer and an etch stop layer.

3. The method of claim 2, wherein the magnetoresistive element includes a magnetic tunnel junction (MTJ) or a double MTJ or a giant magnetoresistive (GMR) structure.

4. The method of claim 1, wherein the intrinsic stress in the multi-layer magnetoresistive structure includes an intrinsic stress of any layer in the multi-layer magnetoresistive structure.

5. The method of claim 1, further comprising:
   integrating the released multi-layer magnetoresistive structure with a second substrate to form the magnetoresistive device.

6. The method of claim 5, wherein the second substrate is selected from the group consisting of: conventional rigid substrates, flexible polymeric substrates, wafers, glass, foil, polydimethylsiloxane (PDMS) substrates, and plastic nitrile rubber substrates.

7. The method of claim 6, wherein the second substrate is a deformable substrate, the method further comprising:
   deforming the second substrate to provide a tensile or a compressive strain to the multi-layer magnetoresistive structure.

8. The method of claim 5, wherein the step of integrating the released multi-layer magnetoresistive structure with a second substrate comprises:
   transferring the released multi-layer magnetoresistive structure to the second substrate by a transferring carrier.

9. The method of claim 8, wherein the transferring carrier is a modified PDMS stamp.

10. The method of claim 8, wherein the transferring carrier is a thermal release tape, and the step of integrating the released multi-layer magnetoresistive structure with a second substrate further comprises:
    heating the thermal release tape after the magnetoresistive structure is transferred to the second substrate.

11. The method of claim 8, wherein the step of integrating the released multi-layer magnetoresistive structure with a second substrate further comprises:
    bonding the released multi-layer magnetoresistive structure to the second substrate by using a glue/adhesive,
    by plasma treating a surface of the second substrate and/or the released multi-layer magnetoresistive structure,
    by a conventional method involving a high temperature or a high pressure, or
    by a wafer or surface-activated or atomic diffusion bonding method.

12. The method of claim 5, further comprising: selecting a method for integrating the released multi-layer magnetoresistive structure with a second substrate according to a predetermined value and/or configuration of a strain to be provided to the magnetoresistive structure.

13. The method of claim 1, further comprising:
    before releasing the multi-layer magnetoresistive structure from the first substrate, fabricating the multi-layer magnetoresistive structure on the first substrate.

14. The method of claim 13, further comprising: engineering the intrinsic stress in the multi-layer magnetoresistive structure to a predetermined value and/or configuration.

15. The method of claim 14, wherein the step of engineering the intrinsic stress in the multi-layer magnetoresistive structure to a predetermined value and/or configuration comprises:
    selecting a material and/or a thickness of an underlayer, an encapsulation layer, a capping layer or any other layer in the magnetoresistive structure;
    determining a thin film deposition condition;
    determining an annealing condition; and/or
    selecting a configuration of the magnetoresistive structure, based on the predetermined value and/or configuration of the intrinsic stress.

16. The method of claim 1, wherein the multi-layer magnetoresistive structure is released from the first substrate by etching technique.

17. The method of claim 16, further comprising adjusting an etching thickness during a process for releasing the magnetoresistive structure from the first substrate to control the relaxation of the intrinsic stress in the multi-layer magnetoresistive structure.

18. The method of claim 1, wherein the magnetic and/or magnetoresistive properties of the magnetoresistive device include coercivity, squareness or abruptness of switching, magnetoresistance (MR) and resistance of the magnetoresistive device.

19. A magnetoresistive device fabricated according to claim 1.

20. A sensor, a data storage device, or a strain gauge, each comprising a magnetoresistive device fabricated according to claim 1.

* * * * *